United States Patent [19]

Lob et al.

[11] 4,047,286
[45] Sept. 13, 1977

[54] PROCESS FOR THE PRODUCTION OF SEMICONDUCTOR ELEMENTS

[75] Inventors: Udo Lob, Eichenau; Fritz Scheidel, Munich, both of Germany

[73] Assignee: Siemens Aktiengesellschaft, Berlin & Munich, Germany

[21] Appl. No.: 686,137

[22] Filed: May 13, 1976

[30] Foreign Application Priority Data

May 20, 1975 Germany .............................. 2522346

[51] Int. Cl.² ............................................. B01J 17/00
[52] U.S. Cl. ....................................... 29/578; 29/580; 29/591; 51/319
[58] Field of Search ................. 29/578, 580, 590, 591; 51/319, 320, 321

[56] References Cited

U.S. PATENT DOCUMENTS

| 3,152,939 | 10/1964 | Borneman | 29/580 |
|---|---|---|---|
| 3,389,457 | 6/1968 | Goldman | 29/580 |
| 3,466,510 | 9/1969 | Maute | 29/580 |
| 3,694,972 | 10/1972 | Emeis | 51/319 |

*Primary Examiner*—W. Tupman
*Attorney, Agent, or Firm*—Hill, Gross, Simpson, Van Santen, Steadman, Chiara & Simpson

[57] ABSTRACT

A process for the production of semiconductor elements is set forth which includes metallizing a side of a large-area semiconductor wafer, having at least two zones of differing conductivity types, applying a soft-solder plate to the metallized side of said large-area wafer, bringing a perforated plate with a desired pattern of holes against said soft-solder plate, said perforated plate being formed of a material which does not form an alloy with said soft-solder plate, subjecting said perforated plate to a load while said soft-solder is heated to its melting temperature, cooling said soft-solder plate and removing it, and subjecting said large-area semiconductor wafer to a sand blast which is directed against the side coated with the solder metal until the large-area wafer has been divided up. The stream of the sand on the said blast may be as wide as the large-area wafer. The metal layer formed on the large-area wafer is preferably formed as two nickel layers and a gold layer.

7 Claims, 5 Drawing Figures

PROCESS FOR THE PRODUCTION OF SEMICONDUCTOR ELEMENTS

BACKGROUND OF THE INVENTION

The present invention relates to a process for the production of semiconductor elements by dividing up to a large-area, metallized semiconductor wafer into a plurality of small-area semiconductor wafers, and the application of a layer of soldering metal.

A process of this type has been disclosed, for example, for the production of high voltage rectifiers, where large-area, metallized semiconductor wafers already provided with one or several pn-junctions are coated with a layer of soldering metal and are soldered to one another to form a stack. This stack is then cut up into individual small-area semiconductor elements by means of a plurality of parallel cuts and a plurality of parallel second cuts running at right angles to the former. It is possible to use this process for the production of high voltage rectifiers, but it is not suitable for the production of small-area semiconductor elements consisting of one single semiconductor wafer, as it constitutes too expensive a method of production for this purpose.

It is also already known to provide a large-area semiconductor wafer with a plurality of small-area electrodes and then to divide up this semiconductor wafer between the electrodes by means of a very fine sand blast emerging from a nozzle. In particular, in the case of small components, this process necessitates a high degree of accuracy and requires a relatively large amount of time unless a set of multiple nozzles is used for the simultaneous production of parallel cuts.

SUMMARY OF THE INVENTION

It is an object of the present invention to provide a process for the production of semiconductor elements of the type mentioned in the introduction, in such a manner that semiconductor elements of small area, for example, up to 15 mm$^2$, can be produced with a considerably lower outlay than was previously possible.

More specifically, the present invention provides a manufacturing process for the production of semiconductor elements which includes taking a large-area semiconductor wafer, forming at least two zones therein by diffusion or otherwise. At least one side of said large-area wafer is then metallized. Thereafter, a softsolder layer is formed on one metallized side. Next a perforated plate formed of a material which will not alloy with the solder is brought against the soft solder layer while the soft-solder is raised to its melting temperature. The openings or holes in the perforated plate correspond to the size and shape of the small-area wafers to be formed. The large-area wafer is then permitted to cool, and the perforated plate then withdrawn. A sand blast is then directed against the large-area wafer with the soft-solder surfaces acting as a mask. This causes the unmasked non-soldered areas of the large wafer to be removed leaving only the number of small areas covered yet by the solder.

The large-area semiconductor wafer is supported prior to the division by a glass plate upon which it is glued by means of wax or the like.

The solder plate preferably consists of a lead-tin-solder with a predominant lead component. The alloying process is improved when, prior to the application of the solder plate, the semiconductor wafer is nickel-plated, and preferably also gold-plated.

The perforated plate can expediently consist of graphite.

BRIEF DESCRIPTION OF THE DRAWINGS

The invention will be explained in detail making reference to an exemplary embodiment, in association with FIGS. 1 to 4, wherein the successive principal steps are diagrammatically illustrated.

DESCRIPTION OF THE PREFERRED EMBODIMENTS

Figure 1:
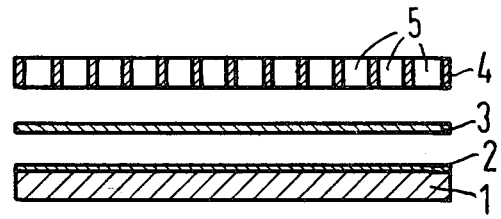
Figure 5:
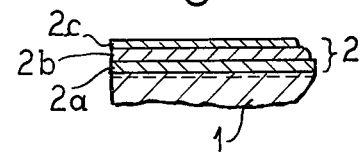
FIG. 5 shows diagrammatically in an enlarged view the three successive metal coatings which form the metal layer shown in FIG. 1.

In FIG. 1, a large-area semiconductor wafer 1 is shown having a metal layer 2. Layer 1 may, for example, be silicon, which is provided with at least two zones of differing conductivity type, which, for example, have been produced by diffusing dopants therein. As shown in FIG. 5, the metal layer 2 preferably consists of a double nickel layer 2a and 2b which can be gold-plated to form a film 2c as protection against corrosion. (See FIG. 5.) The first of the nickel layers 2a is applied currentlessly in accordance with a known process on the semiconductor wafer 1, and is then sintered into the semiconductor wafer at a temperature of several hundred degrees centigrade. The second nickel layer 2b can then be applied, again currentlessly, and thereafter, gold-plating 2c is carried out. To the nickel-plated and gold-plated semiconductor wafer is applied a solder plate 3 which consists of a soft solder. Expediently a soft solder with a high lead content, e.g., 96%, and a comparatively low tin content, for example, 4% is used. A perforated plate 4, provided with a pattern of holes 5, is applied to the solder plate 3. The pattern of holes 5 can be regularly arranged in the form of a grid, or in other desired ways. The perforated plate 4 consists of a material which does not form an alloy with the solder metal, and whose thermal expansion coefficient does not differ considerably from that of the semiconductor wafer. If the semiconductor wafer consists of silicon, it is advisable to use a perforated plate consisting of graphite, molybdenum, tungsten, or a temperature-resistance ceramic. It is also possible to produce the perforated plate from silicon or another semiconductor material.

Figure 2:
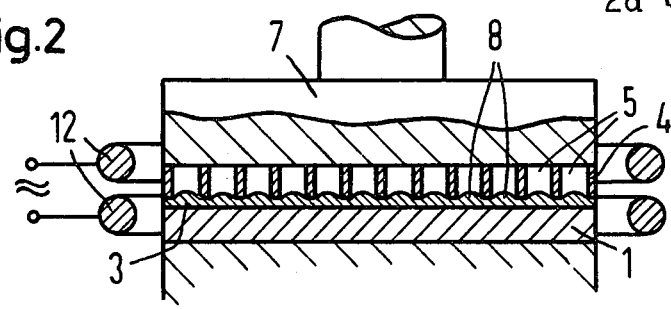

The perforated plate is subsequently loaded with a weight 7 (FIG. 2). The load can, e.g., be approximately 0.5 N/mm$^2$. The unit which consists of semiconductor wafer, solder plate, perforated plate and weight 7 is then heated, for example, in a furnace, to a temperature at which the solder melts. In the case of the above solder composition, a temperature of approximately 400° C will be sufficient. The furnace can expediently be an induction furnace, whose high frequency coil 12 is schematically illustrated in FIG. 2. The force exerted by the weight 7 presses the perforated plate 4 downwards and causes the solder, which is becoming doughy and liquid, into the openings of the pattern of holes 5 in the perforated plate. This gives rise to solder domes 8 which become increasingly higher as the perforated plate is lowered, until the solder located below the holes of the pattern has at least for the major part, moved into the holes of the pattern.

Figure 3:
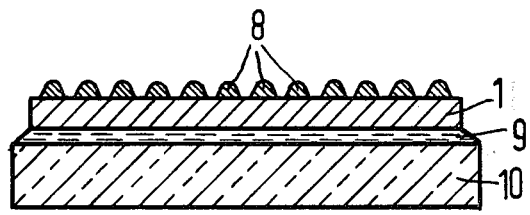

Following the cooling, the weight 7 and the perforated plate 4 are removed. On its upper side, the semiconductor wafer is provided with a plurality of solder domes 8, the arrangement of which on the semiconductor wafer corresponds to the pattern of holes (FIG. 3). The solder domes 8 are alloyed to the metallization of the semiconductor wafer 1, and form the contacts for the small-area semiconductor elements which are to be produced.

Figure 4:
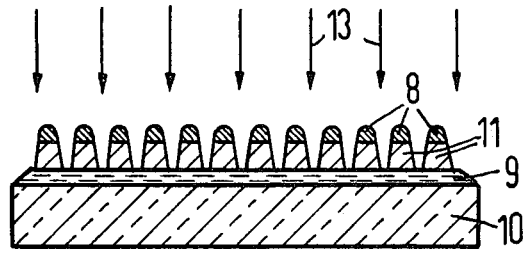

Before large-area semiconductor wafer 1 is divided up, it is first glued, e.g., by means of a wax layer 9, onto a glass plate 10. Then, as indicated in FIG. 4, by a number of parallel arrows, a sand blast 13 is directed onto that side of the semiconductor wafer 1 which is provided with the solder domes. This sand blast can possess a cross-section which corresponds to the diameter of the semiconductor wafer. If may also be less, but then the semiconductor wafer and the sand blast must be moved laterally relative to one another. The sand blast now removes those parts of the semiconductor wafer 1 not covered with a solder dome at a relatively high speed as this is a brittle material, whereas the solder domes 8 which consist of soft solder are removed considerably more slowly. After a short length of time, such, for example, as 2 minutes, the semiconductor wafer 1 has been divided up into a number of small-area semiconductor wafers 11 each of which exhibit one of the solder domes 8 on its upper side.

The advantage of the process of the invention lies in the fact that the contact metal, namely the soft solder, simultaneously serves as mask for the sand blast. This eliminates the need for a special mask or for the use of a precise fine sand blast. It is possible to produce a large number of small-area semiconductor elements with a low outlay. Thus, for example, it is possible to produce 1,000 small-area semiconductor elements of 1.2 mm diameter from a semiconductor wafer of 50 mm diameter. However, the process can also be employed for small-area semiconductor elements having diameters of up to a few millimeters. A further advantage consists in the fact that the small-area semiconductor elements are only coated with solder metal on one side and thus are heavier on one side. Thus, they can be arranged always with the same polarity simply by being shaken into a perforated grid.

It will be apparent to those skilled in the art that many modifications and variations may be effected without departing from the spirit and scope of the novel concepts of the present invention.

We claim as our invention:

1. A method of manufacturing semiconductor elements which includes taking a large-area semiconductor wafer, forming at least two zones therein of different conductivity type, metallizing at least one side of said large area wafer, forming a soft-solder layer on one metallized side, bringing a perforated plate under pressure against said soft-solder layer while the soft-solder is raised to its melting temperature, the perforations in said perforated plate corresponding to the size and shape of the small-area wafers to be formed, whereby surfaces are formed some of which are covered by soft-solder and some of which are not covered by soft-solder, cooling the large-area wafer and withdrawing said perforated plate, subjecting the said surfaces to a sand blast with said soft-solder surfaces acting as a mask, thereby causing the unmasked non-soldered areas of said large area wafer to be removed leaving only the number of small areas still covered by the solder.

2. A method of manufacturing semiconductor elements according to claim 1, in which said perforated plate is formed of a material which will not alloy with said solder.

3. A method of manufacturing semiconductor elements according to claim 1, in which said perforated plate is formed of a material from the group graphite, silicon, molybdenum, tungsten or a temperature-resistant ceramic.

4. A method of manufacturing semiconductor elements according to claim 1, in which said large area wafer is supported prior to the sand blasting step on a glass plate upon which it is glued.

5. A method of manufacturing semiconductor elements according to claim 1, in which said soft solder is a lead-tin-solder composed of approximately 96 lead and 4% tin.

6. A method of manufacturing semiconductor elements according to claim 1, in which the metallizing includes forming a first layer of nickel on one surface of said large-area wafer, sintering said first layer of nickel, applying a second layer of nickel on said first layer, and forming a gold coating on said second layer of nickel.

7. A method of manufacturing semiconductor elements according to claim 1, in which the two zones of different conductivity type are formed by diffusion.

* * * * *